(12) United States Patent
Iguchi et al.

(10) Patent No.: US 12,165,965 B2
(45) Date of Patent: *Dec. 10, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomohiro Iguchi, Himeji Hyogo (JP); Tatsuya Hirakawa, Takasago Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/454,413

(22) Filed: Aug. 23, 2023

(65) Prior Publication Data
US 2023/0395485 A1    Dec. 7, 2023

Related U.S. Application Data

(62) Division of application No. 17/001,559, filed on Aug. 24, 2020, now Pat. No. 11,776,892.

(30) Foreign Application Priority Data

Mar. 24, 2020    (JP) .................. 2020-052529

(51) Int. Cl.
*H01L 23/498* (2006.01)
*H01L 23/04* (2006.01)
*H01L 23/31* (2006.01)

(52) U.S. Cl.
CPC ...... *H01L 23/49861* (2013.01); *H01L 23/041* (2013.01); *H01L 23/3121* (2013.01); *H01L 23/49811* (2013.01)

(58) Field of Classification Search
CPC ............. H01L 23/49861; H01L 23/041; H01L 23/3121; H01L 23/49811
See application file for complete search history.

(56) References Cited

U.S. PATENT DOCUMENTS 6,313,598 B1    11/2001    Tamba et al.
7,151,311 B2    12/2006    Nakajima et al.
(Continued)

FOREIGN PATENT DOCUMENTS

JP    2007-502544 A    2/2007
JP    2013-085470 A    5/2013
(Continued)

*Primary Examiner* — Eugene Lee
(74) *Attorney, Agent, or Firm* — Kim & Stewart LLP (57) ABSTRACT

A semiconductor device according to an embodiment includes: an insulating substrate having a first metal layer and a second metal layer on a surface of the insulating substrate; a semiconductor chip including an upper electrode and a lower electrode, the upper electrode being electrically connected to the first metal layer, the lower electrode being electrically connected to the second metal layer; a first main terminal including a first end and a second end, the first end being electrically connected to the first metal layer; a second main terminal including a third end and a fourth end, the third end being electrically connected to the second metal layer; a first detection terminal being electrically connected between the first end and the second end of the first main terminal; and a second detection terminal being electrically connected to the first metal layer.

6 Claims, 10 Drawing Sheets

(56) References Cited

U.S. PATENT DOCUMENTS

| | | | |
|---|---|---|---|
| 8,441,128 B2 | 5/2013 | Domes | |
| 9,572,291 B2 | 2/2017 | Minamio | |
| 9,793,826 B2 | 10/2017 | Mashimo et al. | |
| 10,074,593 B2 | 9/2018 | Kurz et al. | |
| 11,776,892 B2 * | 10/2023 | Iguchi | H01L 23/041 |
| | | | 257/668 |
| 2005/0035434 A1 | 2/2005 | Fissore et al. | |
| 2010/0127371 A1 | 5/2010 | Tschirbs | |
| 2014/0035605 A1 | 2/2014 | Kurz et al. | |
| 2015/0187689 A1 | 7/2015 | Nashida | |
| 2016/0190915 A1 | 6/2016 | Horiuchi et al. | |
| 2016/0294379 A1 | 10/2016 | Hayashiguchi et al. | |
| 2016/0343642 A1* | 11/2016 | Komatsu | H01L 24/83 |
| 2017/0077068 A1 | 3/2017 | Horio et al. | |
| 2017/0162462 A1* | 6/2017 | Hatasa | H01L 23/3675 |
| 2018/0090338 A1* | 3/2018 | Yoshihara | H01L 23/3735 |
| 2019/0148258 A1* | 5/2019 | Taniguchi | H01L 23/49811 |
| | | | 257/668 |
| 2020/0357711 A1* | 11/2020 | Hoehn | H01L 23/057 |
| 2023/0135461 A1* | 5/2023 | Aoki | H01L 25/18 |
| | | | 257/675 |

FOREIGN PATENT DOCUMENTS

| | | |
|---|---|---|
| JP | 5930954 B2 | 6/2016 |
| JP | 6373702 B2 | 8/2018 |
| JP | 6382097 B2 | 8/2018 |
| JP | 2021-027145 A | 2/2021 |
| WO | 2019/034741 A1 | 2/2019 |

* cited by examiner

FIG.3A
BB' CROSS SECTION

FIG.3B
CC' CROSS SECTION

SEMICONDUCTOR DEVICE

CROSS-REFERENCE TO RELATED APPLICATIONS

This application is a division of U.S. patent application Ser. No. 17/001,559, filed on Aug. 24, 2020, which is based upon and claims the benefit of priority from Japanese Patent Application No. 2020-052529, filed on Mar. 24, 2020, the entire contents of each of which are incorporated herein by reference.

FIELD

Embodiments described herein relate generally to semiconductor devices.

BACKGROUND

In a power semiconductor module, for example, a power semiconductor chip is mounted on a metal base with an insulating substrate interposed between the power semiconductor chip and the metal base. The power semiconductor chip is, for example, a metal oxide field effect transistor (MOSFET), an insulated gate bipolar transistor (IGBT), or a diode.

In the power semiconductor module, there are cases where a short circuit in the module is required to be detected or the life prediction of the module is required to be performed. A detection terminal for measuring a main current flowing between the two main terminals is provided for detecting a short circuit in the module and performing the life prediction of the module. Two detection terminals are provided in a main current path, and the main current is obtained by integrating the voltage detected between the two detection terminals.

In order to improve the measurement accuracy of the main current, an inductance of a certain size or more is required in the main current path between the two detection terminals. In order to increase the inductance, for example, the length of the metal layer on the insulating substrate is required to be increased, an additional metal layer is required to be provided, the length of the bonding wire is required to be increased, or an additional bonding wire is required to be provided. For this reason, there is a problem that the size of the power semiconductor module becomes large.

DETAILED DESCRIPTION

A semiconductor device according to an embodiment includes: an insulating substrate having a first metal layer and a second metal layer on a surface of the insulating substrate; a semiconductor chip including an upper electrode and a lower electrode, the upper electrode being electrically connected to the first metal layer, the lower electrode being electrically connected to the second metal layer; a first main terminal including a first end and a second end, the first end being electrically connected to the first metal layer; a second main terminal including a third end and a fourth end, the third end being electrically connected to the second metal layer; a first detection terminal being electrically connected between the first end and the second end of the first main terminal; and a second detection terminal being electrically connected to the first metal layer.

In this specification, in some cases, the same or similar members are denoted by the same reference numerals, and duplicate description may be omitted.

In this specification, in some cases, in order to illustrate the positional relationship of parts and the like, the upward direction of the drawings may be referred to as "upper", and the downward direction of the drawings may be referred to as "lower". In this specification, the terms "upper" and "lower" do not necessarily indicate the relationship with the direction of gravity.

First Embodiment

A semiconductor device of a first embodiment includes: an insulating substrate having a first metal layer and a second metal layer on a surface of the insulating substrate; a semiconductor chip including an upper electrode and a lower electrode, the upper electrode being electrically connected to the first metal layer, the lower electrode being electrically connected to the second metal layer; a first main terminal including a first end and a second end, the first end being electrically connected to the first metal layer; a second main terminal including a third end and a fourth end, the third end being electrically connected to the second metal layer; a first detection terminal being electrically connected between the first end and the second end of the first main terminal; and a second detection terminal being electrically connected to the first metal layer.

Figure 1:
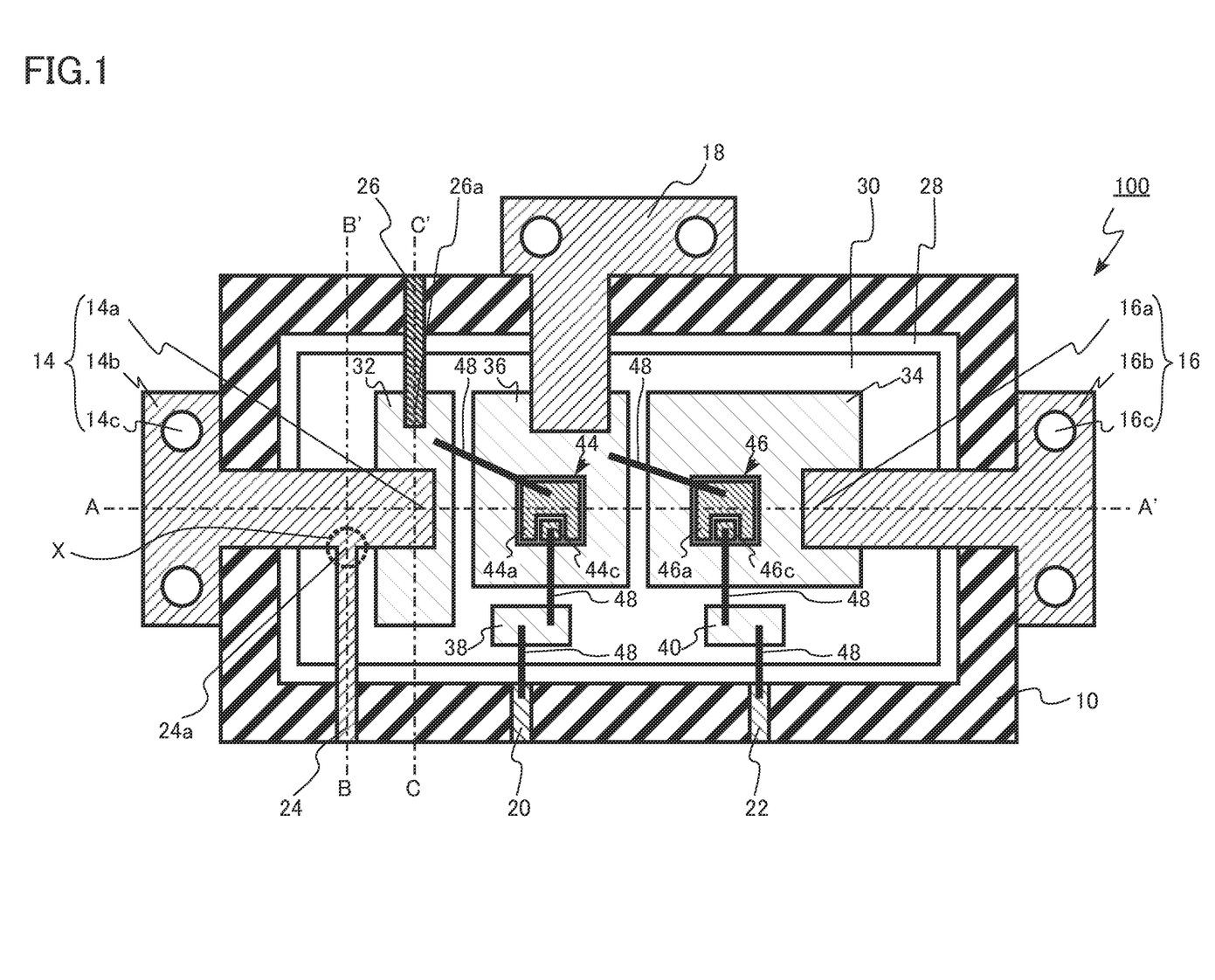
FIG. 1 is a schematic top view of a semiconductor device according to a first embodiment.
Figure 2:
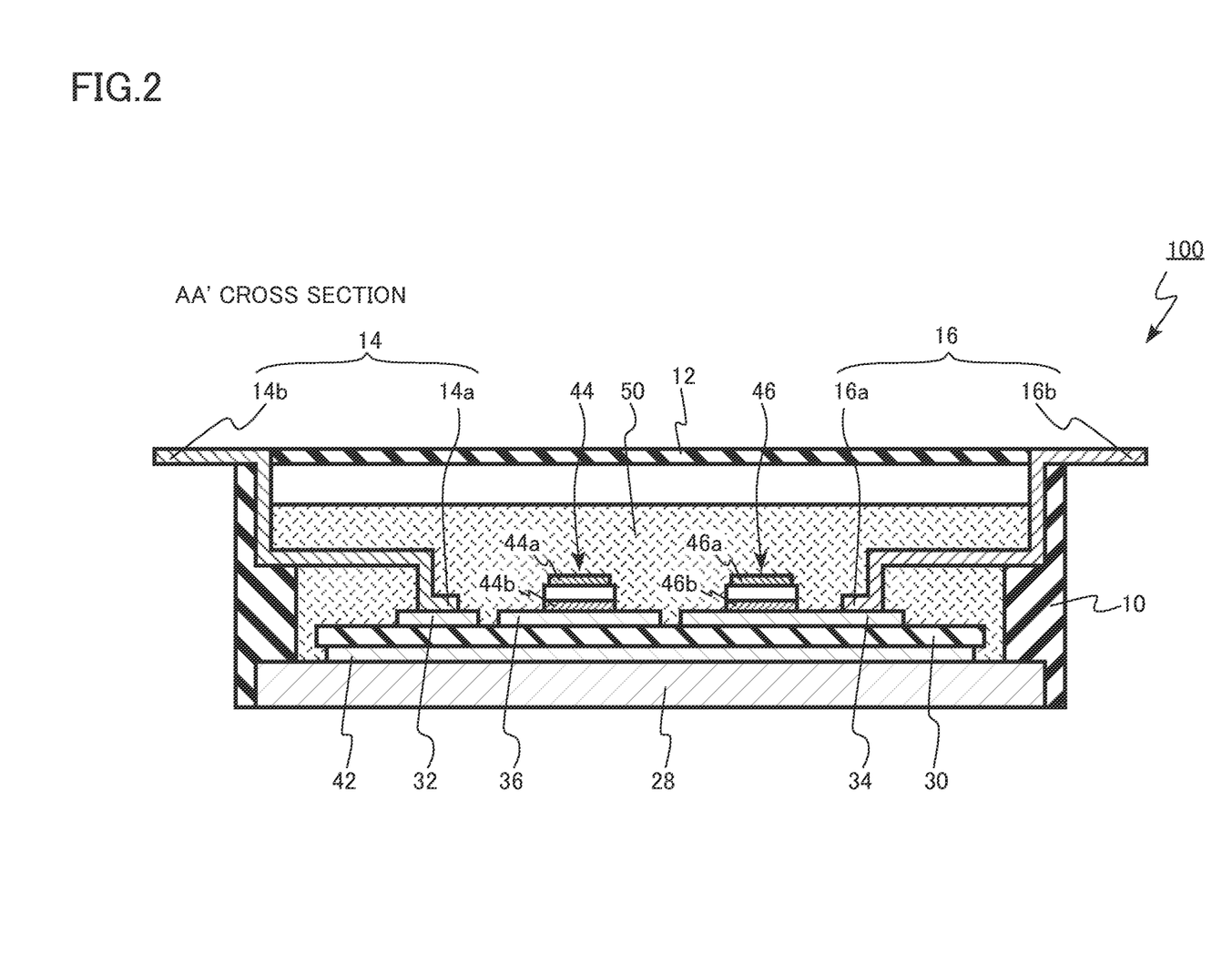
FIG. 2 is a schematic cross-sectional view of the semiconductor device according to the first embodiment.
Figure 3A:
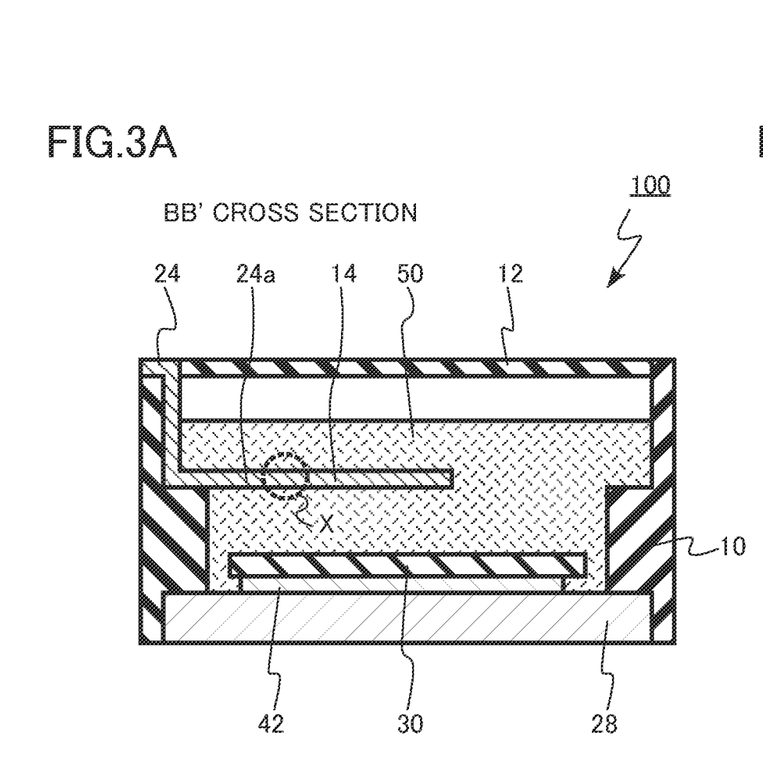
FIGS. 3A and 3B are schematic cross-sectional views of the semiconductor device according to the first embodiment.
Figure 3B:
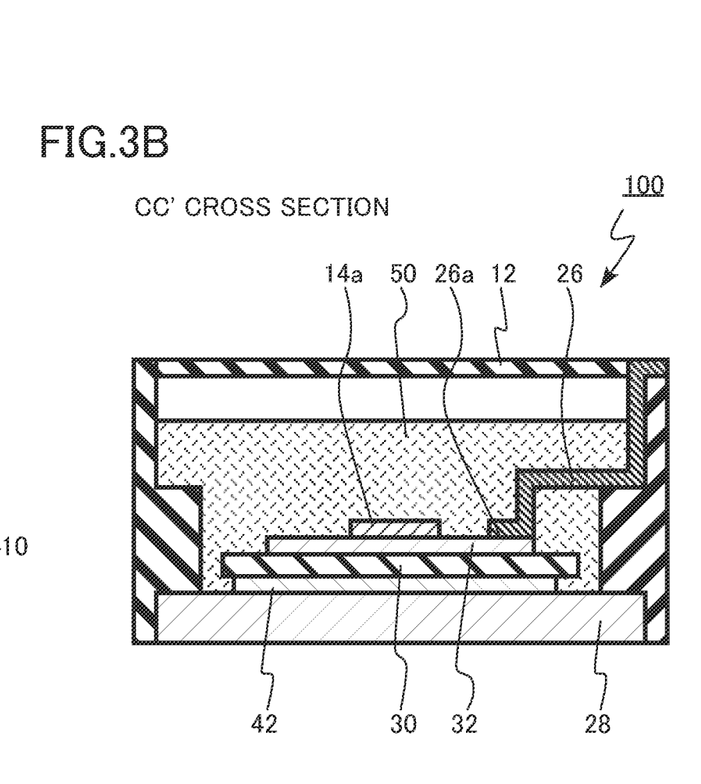
Figure 4:
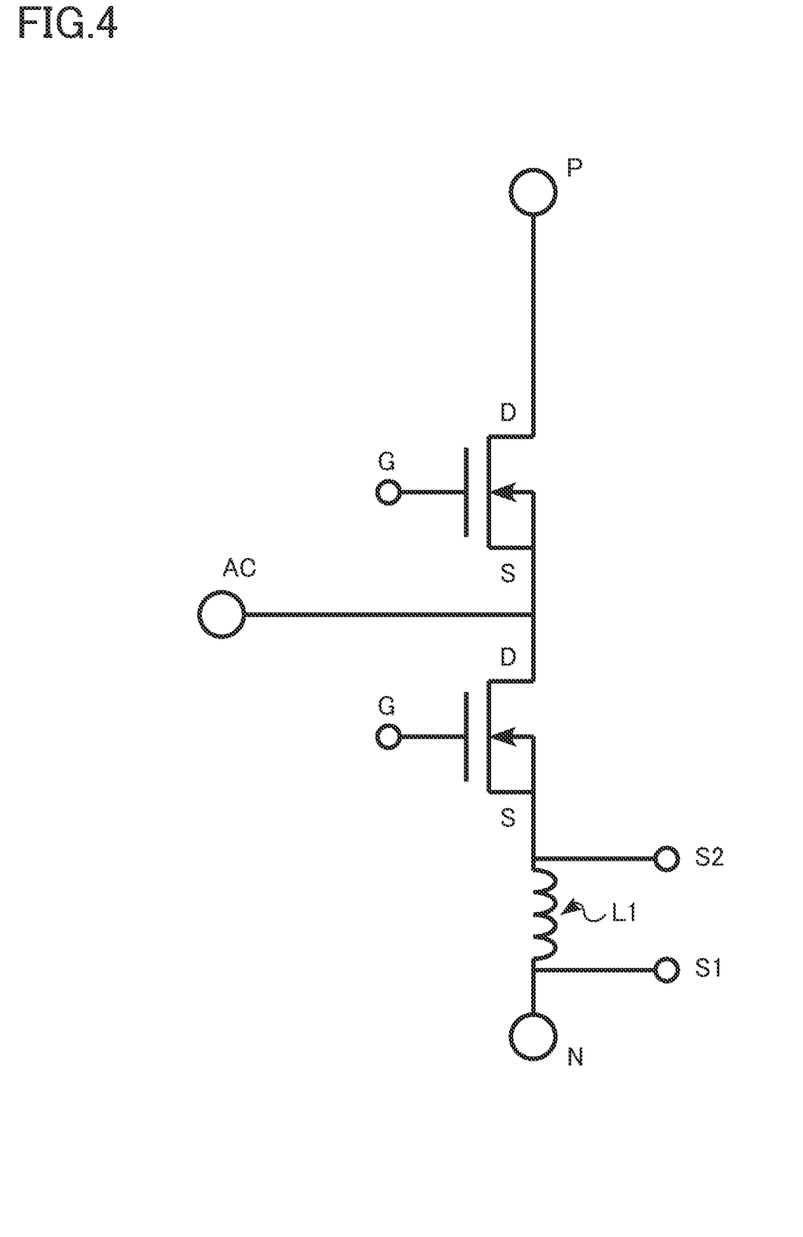
FIG. 4 is an equivalent circuit diagram of the semiconductor device according to the first embodiment.

FIG. 1 is a schematic top view of the semiconductor device according to the first embodiment. FIG. 2 is a schematic cross-sectional view of the semiconductor device according to the first embodiment. FIG. 2 illustrates a cross section taken along the line AA' of FIG. 1. FIGS. 3A and 3B are schematic cross-sectional views of the semiconductor device according to the first embodiment. FIG. 3A illustrates a cross section taken along the line BB' of FIG. 1. FIG. 3B illustrates a cross section taken along the line CC' of FIG. 1. FIG. 4 is an equivalent circuit diagram of the semiconductor device according to the first embodiment.

The semiconductor device of the first embodiment is a power semiconductor module 100. As illustrated in FIG. 4, in the power semiconductor module 100 according to the first embodiment, two MOSFETs are connected in series. The power semiconductor module according to the first embodiment is a so-called "2 in 1" type module in which a half bridge circuit can be configured with one module. For example, a three-phase inverter circuit can be configured by using three power semiconductor modules according to the first embodiment.

As illustrated in FIG. 4, the power semiconductor module 100 has a power terminal N, a power terminal P, an AC output terminal AC, a first detection terminal S1, a second detection terminal S2, and an inductor L1. The first detection terminal S1 and the second detection terminal S2 have a function of monitoring a main current flowing between the power terminal N and the AC output terminal AC.

The power semiconductor module 100 according to the first embodiment includes a resin case 10 (frame body), a lid 12, a first main terminal 14, a second main terminal 16, an AC output terminal 18, a first gate terminal 20, a second gate terminal 22, a first detection terminal 24, a second detection terminal 26, a metal base 28, an insulating substrate 30, a first metal layer 32, a second metal layer 34, a third metal layer 36, a first gate metal layer 38, a second gate metal layer 40, a back-surface metal layer 42, a first MOSFET 44 (semiconductor chip), a second MOSFET 46, a bonding wire 48, and a sealing resin 50 (sealing material).

The first main terminal 14 has a first end 14a, a second end 14b, and a first wiring connection hole 14c (hole). The second main terminal 16 has a third end 16a, a fourth end 16b, and a second wiring connection hole 16c. The first detection terminal 24 has an end 24a. The second detection terminal 26 has an end 26a.

FIG. 1 is a top view of the power semiconductor module 100 from which the lid 12 and the sealing resin 50 are removed.

The metal base 28 is made of, for example, copper. For example, when mounting the power semiconductor module 100 on a product, a heat dissipation plate (not illustrated) is connected to a back surface of the metal base 28.

The insulating substrate 30 is provided on the metal base 28. The insulating substrate 30 is provided between the metal base 28 and the first MOSFET 44 and between the metal base 28 and the second MOSFET 46. The insulating substrate 30 has a function of electrically separating the metal base 28 from the first MOSFET 44 and the second MOSFET 46.

The insulating substrate 30 is made of, for example, ceramic. The insulating substrate 30 is made of, for example, aluminum oxide, aluminum nitride, or silicon nitride.

A first metal layer 32, a second metal layer 34, a third metal layer 36, a first gate metal layer 38, and a second gate metal layer 40 are provided on the surface of the insulating substrate 30. The first metal layer 32, the second metal layer 34, the third metal layer 36, the first gate metal layer 38, and the second gate metal layer 40 are made of, for example, copper.

The back-surface metal layer 42 is provided on the back surface of the insulating substrate 30. The back-surface metal layer 42 is made of, for example, copper. The back-surface metal layer 42 is bonded to the metal base 28 by using, for example, a solder layer or a silver nanoparticle layer (not illustrated).

The resin case 10 is provided around the metal base 28 and the insulating substrate 30. A portion of the resin case 10 is provided on the metal base 28. The resin case 10 is an example of a frame body. The resin case 10 has a function of protecting the first MOSFET 44, the second MOSFET 46, and the insulating substrate 30.

The lid 12 is provided on the resin case 10. The lid 12 interposes the first MOSFET 44 and the second MOSFET 46 between the lid 12 and the insulating substrate 30. The lid 12 has a function of protecting the first MOSFET 44, the second MOSFET 46, and the insulating substrate 30.

The first MOSFET 44 is provided on the insulating substrate 30. The first MOSFET 44 has a first source electrode 44a, a first drain electrode 44b, and a first gate electrode 44c. The first source electrode 44a is an example of an upper electrode. The first drain electrode 44b is an example of a lower electrode.

The first MOSFET 44 is provided on the third metal layer 36. The first drain electrode 44b is fixed on the third metal layer 36 by using, for example, a solder layer or a silver nanoparticle layer (not illustrated). The first drain electrode 44b is bonded to the third metal layer 36.

The first MOSFET 44 is formed by using, for example, silicon carbide.

The first source electrode 44a is electrically connected to the first metal layer 32. The first source electrode 44a is electrically connected to the first metal layer 32 via the bonding wire 48.

The first drain electrode 44b is electrically connected to the second metal layer 34. The first drain electrode 44b is electrically connected to the second metal layer 34 via the third metal layer 36, the bonding wire 48, and the second MOSFET 46.

The second MOSFET 46 is provided on the insulating substrate 30. The second MOSFET 46 has a second source electrode 46a, a second drain electrode 46b, and a second gate electrode 46c.

The second MOSFET 46 is provided on the second metal layer 34. The second drain electrode 46b is fixed on the second metal layer 34 by using, for example, a solder layer or a silver nanoparticle layer (not illustrated). The second drain electrode 46b is bonded to the second metal layer 34.

The second source electrode 46a is electrically connected to the third metal layer 36. The second source electrode 46a is electrically connected to the third metal layer 36 via the bonding wire 48.

The second MOSFET 46 is formed by using, for example, silicon carbide.

The resin case 10 is filled with the sealing resin 50. The sealing resin 50 is surrounded by the resin case 10. The sealing resin 50 covers the first MOSFET 44, the second MOSFET 46, and the insulating substrate 30. The sealing resin 50 is an example of a sealing material.

The sealing resin 50 has a function of protecting the first MOSFET 44, the second MOSFET 46, and the insulating substrate 30. In addition, the sealing resin 50 has a function of insulating the first MOSFET 44, the second MOSFET 46, and the insulating substrate 30.

The sealing resin 50 contains a resin. The sealing resin 50 is made of, for example, silicone gel. As the sealing resin 50, for example, other resins such as an epoxy resin and a polyimide resin can be employed.

The first main terminal 14 has a first end 14a, a second end 14b, and a first wiring connection hole 14c (hole). The first main terminal 14 is electrically connected to the first metal layer 32.

The first end 14a is electrically connected to the first metal layer 32. The first end 14a is fixed to the first metal layer 32. The first end 14a is bonded to the first metal layer 32 by using, for example, a solder layer or a silver nanoparticle layer (not illustrated). The first end 14a is bonded to the first metal layer 32 by, for example, ultrasonic bonding.

The first end 14a is provided inside the resin case 10. The first end 14a is surrounded by the sealing resin 50.

The second end 14b is provided outside the resin case 10 and the lid 12. A first wiring connection hole 14c for connecting a wiring such as a bus bar is provided in the second end 14b.

The first main terminal 14 corresponds to the power terminal N in FIG. 4. For example, a negative voltage is applied to the first main terminal 14 from the outside.

The first main terminal 14 is formed of a metal plate. The first main terminal 14 is made of, for example, copper.

The second main terminal 16 has a third end 16a, a fourth end 16b, and a second wiring connection hole 16c (hole). The second main terminal 16 is electrically fixed to the second metal layer 34.

The third end 16a is electrically connected to the second metal layer 34. The third end 16a is fixed to the second metal layer 34. The third end 16a is bonded to the second metal layer 34 by using, for example, a solder layer or a silver nanoparticle layer (not illustrated). The third end 16a is bonded to the second metal layer 34 by, for example, ultrasonic bonding.

The third end 16a is provided inside the resin case 10. The third end 16a is surrounded by the sealing resin 50.

The fourth end 16b is provided outside the resin case 10 and the lid 12. A second wiring connection hole 16c for connecting a wiring such as a bus bar is provided to the fourth end 16b.

The second main terminal 16 corresponds to the power terminal P in FIG. 4. For example, a positive voltage is applied to the second main terminal 16 from the outside.

The second main terminal 16 is formed of a metal plate. The second main terminal 16 is made of, for example, copper.

The AC output terminal 18 is electrically connected to the third metal layer 36. One end of the AC output terminal 18 is fixed to, for example, the third metal layer 36. The AC output terminal 18 corresponds to the AC output terminal AC in FIG. 4. The AC output terminal 18 outputs the output current of the half bridge circuit.

The first gate terminal 20 is electrically connected to the gate electrode 44c of the first MOSFET 44 via the bonding wire 48, the first gate metal layer 38, and the bonding wire 48. The first gate terminal 20 has a function of applying a gate voltage signal for controlling the first MOSFET 44 to the gate electrode 44c.

The second gate terminal 22 is electrically connected to the gate electrode 46c of the second MOSFET 46 via the bonding wire 48, the second gate metal layer 40, and the bonding wire 48. The second gate terminal 22 has a function of applying a gate voltage signal for controlling the second MOSFET 46 to the gate electrode 46c.

The first detection terminal 24 is electrically connected to the first main terminal 14. The first detection terminal 24 is fixed between the first end 14a and the second end 14b of the first main terminal 14. The first detection terminal 24 has an end 24a. The end 24a of the first detection terminal 24 is fixed to the first main terminal 14 at the connection portion (X in FIGS. 1 and 3A).

The end of the first detection terminal 24 opposite to end 24a is provided, for example, outside the resin case 10 and the lid 12. The connection portion X between the first detection terminal 24 and the first main terminal 14 is located between the insulating substrate 30 and the lid 12.

At least a portion of the first detection terminal 24 is surrounded by the sealing resin 50. The connection portion X between the first detection terminal 24 and the first main terminal 14 is surrounded by the sealing resin 50.

The first detection terminal 24 corresponds to the first detection terminal S1 in FIG. 4. The first detection terminal 24 has a function of monitoring a main current flowing between the first main terminal 14 and the second main terminal 16.

The first detection terminal 24 is made of a metal. The first detection terminal 24 is made of, for example, copper.

The first detection terminal 24 is integrally formed of, for example, the same material as the first main terminal 14.

The first detection terminal 24 can be connected to the first main terminal 14 by using, for example, a bonding wire.

The second detection terminal 26 is electrically connected to the first metal layer 32. The second detection terminal 26 has an end 26a. The end 26a of the second detection terminal 26 is fixed to, for example, the first metal layer 32.

The end 26a of the second detection terminal 26 is bonded to the first metal layer 32 by using, for example, a solder layer or a silver nanoparticle layer (not illustrated). In addition, the end 26a is bonded to the first metal layer 32 by, for example, ultrasonic bonding.

The end of the second detection terminal 26 opposite to the end 26a is provided, for example, outside the resin case 10 and the lid 12.

In addition, the second detection terminal 26 may not be directly fixed to the first metal layer 32 as long as the second detection terminal 26 is electrically connected to the first metal layer 32. For example, the second detection terminal 26 and the first metal layer 32 may be electrically connected via the bonding wire 48. In addition, for example, the second detection terminal 26 and the first metal layer 32 may be electrically connected to each other with a metal layer different from the first metal layer 32 interposed between the second detection terminal 26 and the first metal layer 32.

At least a portion of the second detection terminal 26 is surrounded by the sealing resin 50.

The second detection terminal 26 corresponds to the second detection terminal S2 in FIG. 4. The second detection terminal 26 has a function of monitoring a main current flowing between the first main terminal 14 and the second main terminal 16.

The second detection terminal 26 is made of a metal. The second detection terminal 26 is made of, for example, copper.

Next, the function and effect of the power semiconductor module 100 according to the first embodiment will be described.

In the power semiconductor module, there are cases where it a short circuit in the module is required to be detected or the life prediction of the module is required to be performed. A detection terminal for measuring a main current flowing between the two main terminals is provided for detecting a short circuit in the module and performing the life prediction of the module. The two detection terminals are provided in the main current path, and the main current is obtained by integrating the voltage detected between the two detection terminals.

In order to improve the measurement accuracy of the main current, an inductance of a certain magnitude or more is required for the main current path between the two detection terminals. For example, a case where the first detection terminal S1 and the second detection terminal S2 are provided on the power terminal N side as illustrated in FIG. 4 is considered. The inductor L1 having an inductance of a certain magnitude or more is required for the main path between the first detection terminal S1 and the second detection terminal S2.

In order to increase the inductance of the main current path between the two detection terminals, for example, the length of the metal layer on the insulating substrate is required to be increased, an additional metal layer is required to be provided, or the length of the bonding wire is required to be increased, or an additional bonding wires is required to be provided. For this reason, there is a problem that the size of the power semiconductor module becomes large.

In the power semiconductor module 100 according to the first embodiment, the first detection terminal 24 is connected between the first end 14a and the second end 14b of the first main terminal 14. Therefore, the main current path from the connection portion X to the connection portion between the second detection terminal 26 and the first metal layer 32 functions as the inductor L1 in FIG. 4.

In the power semiconductor module 100 according to the first embodiment, a portion of the first main terminal 14 can be allowed to function as the inductor L1. Therefore, in order to increase the inductance of the main current path between the two detection terminals, for example, the length of the metal layer on the insulating substrate is not required to be increased, an additional metal layer is not required to be provided, the length of the bonding wire is not required to be increased, or an additional bonding wire is not required to be provided. That is, in order to increase the inductance of the main current path between the two detection terminals, an additional structure is not required to be added. Therefore, even in a case where the first detection terminal 24 and the second detection terminal 26 are provided, the miniaturization of the power semiconductor module 100 can be realized.

From the viewpoint of increasing the measurement accuracy of the main current, the inductance between the first detection terminal 24 and the second detection terminal 26 is preferably 2 nH or more.

In the power semiconductor module 100 according to the first embodiment, the position of the connection portion X between the first detection terminal 24 and the first main terminal 14 can be set arbitrarily. Therefore, adjustment of the magnitude of the inductance of the main current path is facilitated.

In addition, when the temperature change between the main current paths between the two detection terminals is large, the change in inductance between the two detection terminals becomes large. When the change in inductance becomes large, the measurement accuracy of the main current decreases.

In the power semiconductor module 100 according to the first embodiment, the connection portion X between the first detection terminal 24 and the first main terminal 14 is provided at a position apart from the heat source. A heat generation is likely to occur at the second end 14b due to contact resistance of a wire such as a bus bar connected to the second end 14b. A certain distance from the second end 14b where heat generation is likely to occur to the connection portion X is maintained. In addition, a certain distance from the first MOSFET 44 and the second MOSFET 46, which generate heat due to device operation, to the connection portion X is maintained. The certain distances necessary to avoid temperature increase of the connection portion X can be maintained. Therefore, the change in inductance due to the temperature change is suppressed. Therefore, the decrease in the measurement accuracy of the main current is suppressed.

As described above, according to the first embodiment, the miniaturization of the power semiconductor module can be realized. In addition, adjustment of the inductance between the two detection terminals is facilitated. In addition, the decrease in the measurement accuracy of the main current due to the temperature change is suppressed.

Second Embodiment

A semiconductor device according to a second embodiment includes: an insulating substrate having a first metal layer and a second metal layer on a surface of the insulating substrate; a semiconductor chip including an upper electrode and a lower electrode, the upper electrode being electrically connected to the first metal layer, the lower electrode being electrically connected to the second metal layer; a first main terminal including a first end and a second end, the first end being electrically connected to the first metal layer; a second main terminal including a third end and a fourth end, the third end being electrically connected to the second metal layer; a first detection terminal being electrically connected between the third end and the fourth end of the second main terminal; and a second detection terminal being electrically connected to the second metal layer.

The semiconductor device of the second embodiment is different from the semiconductor device according to the first embodiment in that the semiconductor device of the second embodiment includes the first detection terminal fixed between the third end and the fourth end of the second main terminal and the second detection terminal electrically connected to the second metal layer. That is, the semiconductor device of the second embodiment is different from the first embodiment in that the first detection terminal is provided to the second main terminal. Hereinafter, a portion of the contents overlapping with those of the first embodiment will be omitted in description.

Figure 5:
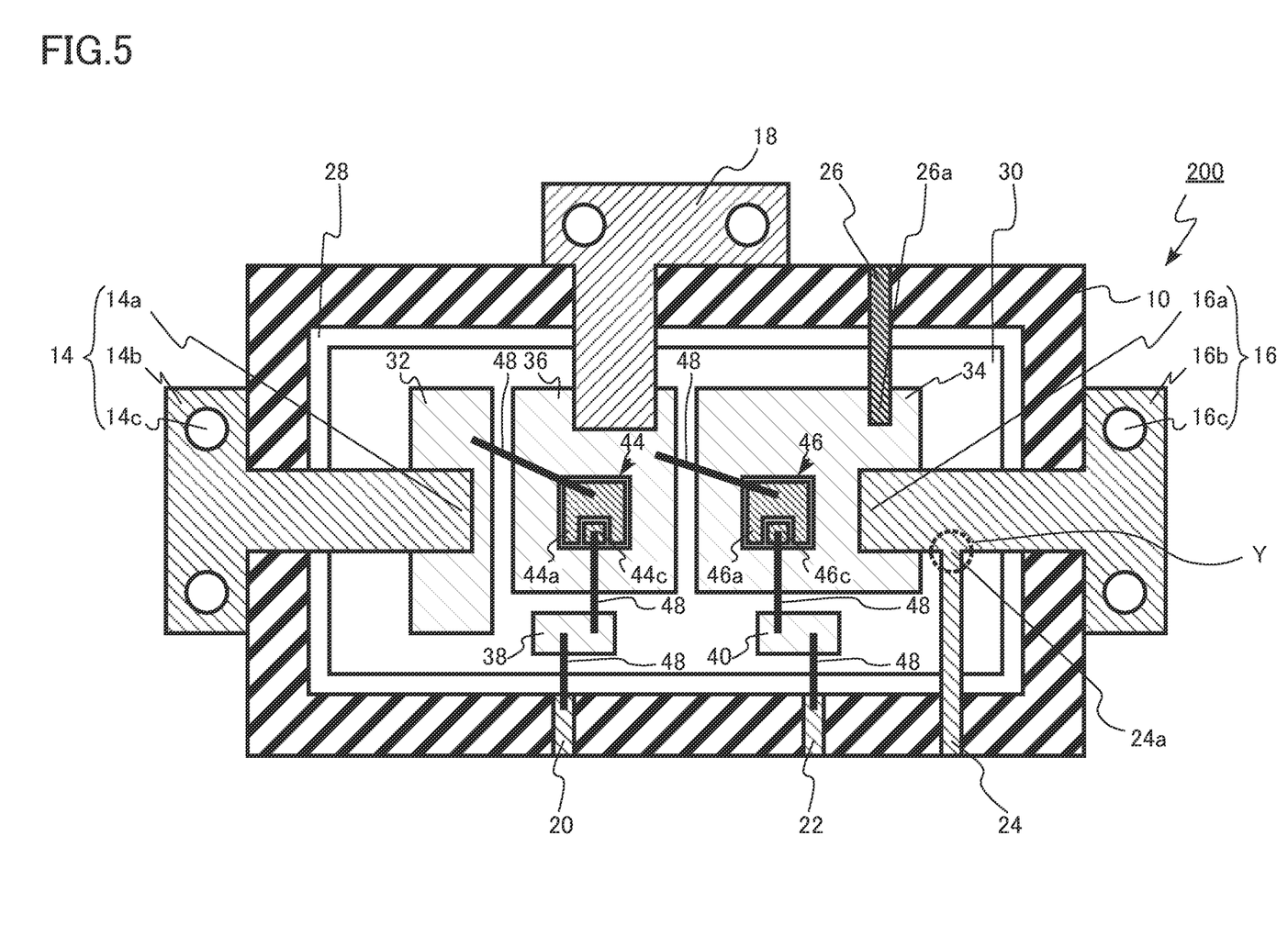
FIG. 5 is a schematic top view of a semiconductor device according to a second embodiment.
Figure 6:
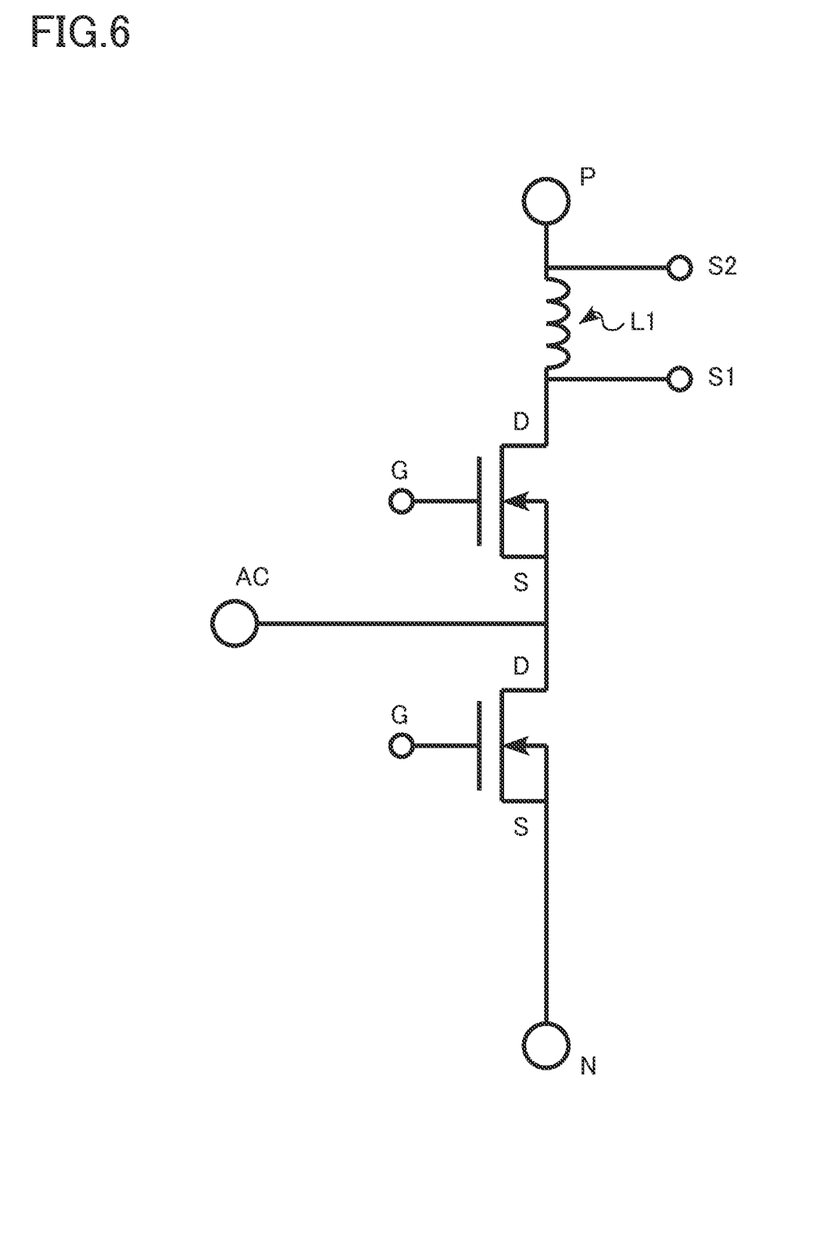
FIG. 6 is an equivalent circuit diagram of the semiconductor device according to the second embodiment.

FIG. 5 is a schematic top view of the semiconductor device according to the second embodiment. FIG. 5 is a diagram corresponding to FIG. 1 of the first embodiment. FIG. 6 is an equivalent circuit diagram of the semiconductor device according to the second embodiment.

The semiconductor device of the second embodiment is a power semiconductor module 200. As illustrated in FIG. 6, in the power semiconductor module 200 according to the second embodiment, two MOSFETs are connected in series. The power semiconductor module according to the second embodiment is a so-called "2 in 1" type module in which a half bridge circuit can be configured with one module. For example, a three-phase inverter circuit can be configured by using three power semiconductor modules according to the second embodiment.

As illustrated in FIG. 6, the power semiconductor module 200 has a power terminal N, a power terminal P, an AC output terminal AC, a first detection terminal S1, a second detection terminal S2, and an inductor L1. The first detection terminal S1 and the second detection terminal S2 have a function of monitoring a main current flowing between the power terminal N and the power terminal P.

The power semiconductor module 200 according to the second embodiment includes a resin case 10, a lid 12, a first main terminal 14, a second main terminal 16, an AC output terminal 18, a first gate terminal 20, a second gate terminal 22, a first detection terminal 24, a second detection terminal 26, a metal base 28, an insulating substrate 30, a first metal layer 32, a second metal layer 34, a third metal layer 36, a first gate metal layer 38, a second gate metal layer 40, a back-surface metal layer 42, a first MOSFET 44 (semiconductor chip), a second MOSFET 46, a bonding wire 48, and a sealing resin 50 (sealing material).

The first main terminal 14 has a first end 14a, a second end 14b, and a first wiring connection hole 14c (hole). The second main terminal 16 has a third end 16a, a fourth end 16b, and a second wiring connection hole 16c. The first detection terminal 24 has an end 24a. The second detection terminal 26 has an end 26a.

FIG. 5 is a top view of the power semiconductor module 200 from which the lid 12 and the sealing resin 50 are removed.

The first main terminal 14 has a first end 14a, a second end 14b, and a first wiring connection hole 14c (hole). The first main terminal 14 is electrically connected to the first metal layer 32.

The first main terminal 14 corresponds to the power terminal N in FIG. 6. For example, a negative voltage is applied to the first main terminal 14 from the outside.

The second main terminal 16 has a third end 16a, a fourth end 16b, and a second wiring connection hole 16c (hole). The second main terminal 16 is electrically fixed to the second metal layer 34.

The second main terminal 16 corresponds to the power terminal P in FIG. 6. For example, a positive voltage is applied to the second main terminal 16 from the outside.

The first detection terminal 24 is electrically connected to the second main terminal 16. The first detection terminal 24 is fixed between the third end 16a and the fourth end 16b of the second main terminal 16. The first detection terminal 24 has an end 24a. The end 24a of the first detection terminal 24 is fixed to the second main terminal 16 at the connection portion (Y in FIG. 5).

The end of the first detection terminal 24 opposite to the end 24a is provided, for example, outside the resin case 10 and the lid 12. The connection portion Y between the first detection terminal 24 and the second main terminal 16 is located between the insulating substrate 30 and the lid 12.

At least a portion of the first detection terminal 24 is surrounded by the sealing resin 50. The connection portion Y between the first detection terminal 24 and the second main terminal 16 is surrounded by the sealing resin 50.

The first detection terminal 24 corresponds to the first detection terminal S1 in FIG. 6. The first detection terminal 24 has a function of monitoring a main current flowing between the first main terminal 14 and the second main terminal 16.

The first detection terminal 24 is made of a metal. The first detection terminal 24 is made of, for example, copper.

The first detection terminal 24 is integrally formed of, for example, the same material as the second main terminal 16.

The first detection terminal 24 can be connected to the second main terminal 16 by using, for example, a bonding wire.

The second detection terminal 26 is electrically connected to the second metal layer 34. The second detection terminal 26 has an end 26a. The end 26a of the second detection terminal 26 is fixed to, for example, the second metal layer 34.

The end 26a of the second detection terminal 26 is bonded to the second metal layer 34 by using, for example, a solder layer or a silver nanoparticle layer (not illustrated). The end 26a is bonded by, for example, ultrasonic bonding.

The end of the second detection terminal 26 opposite to the end 26a is provided, for example, outside the resin case 10 and the lid 12.

The second detection terminal 26 may not be directly fixed to the second metal layer 34 as long as the second detection terminal 26 is electrically connected to the second metal layer 34. For example, the second detection terminal 26 and the second metal layer 34 may be electrically connected via the bonding wire 48. In addition, for example, the second detection terminal 26 and the second metal layer 34 may be electrically connected each other with a metal layer different from the second metal layer 34 interposed between the second detection terminal 26 and the second metal layer 34.

At least a portion of the second detection terminal 26 is surrounded by the sealing resin 50.

The second detection terminal 26 corresponds to the second detection terminal S2 in FIG. 6. The second detection terminal 26 has a function of monitoring a main current flowing between the first main terminal 14 and the second main terminal 16.

The second detection terminal 26 is made of a metal. The second detection terminal 26 is made of, for example, copper.

As described above, according to the second embodiment, similarly to the first embodiment, it is possible to realize the miniaturization of the power semiconductor module. In addition, adjustment of the inductance between the two detection terminals is facilitated. In addition, the decrease in the measurement accuracy of the main current due to the temperature change is suppressed.

Third Embodiment

A semiconductor device according to a third embodiment is different from the semiconductor device according to the first embodiment in that a sealing material has a first portion and a second portion made of a material different from that of the first portion, and a connection portion between the first main terminal and the first detection terminal is surrounded by the second portion. Hereinafter, a portion of the contents overlapping with those of the first embodiment will be omitted in description.

Figure 7:
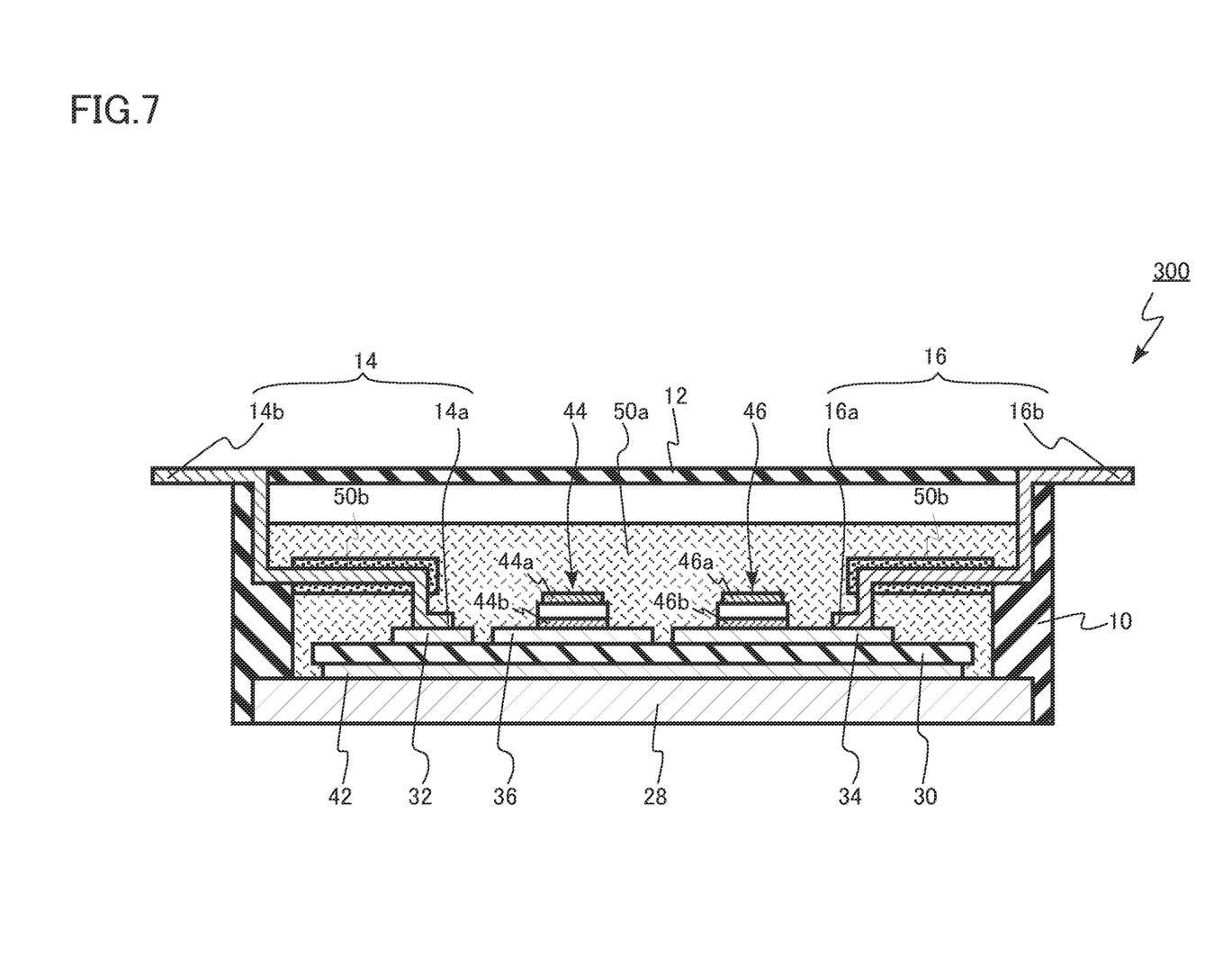
FIG. 7 is a schematic cross-sectional view of a semiconductor device according to a third embodiment.
Figure 8A:
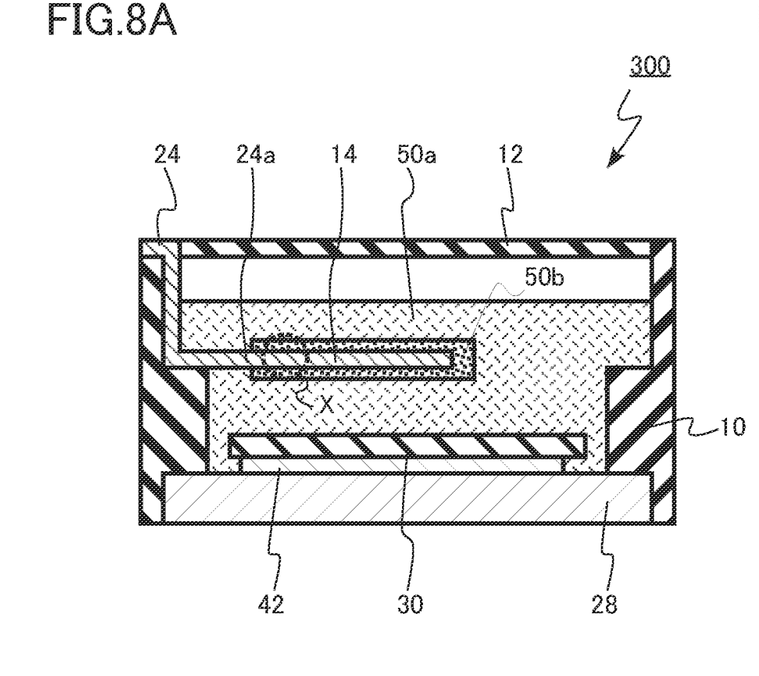
FIGS. 8A and 8B are schematic cross-sectional views of the semiconductor device according to the third embodiment.
Figure 8B:
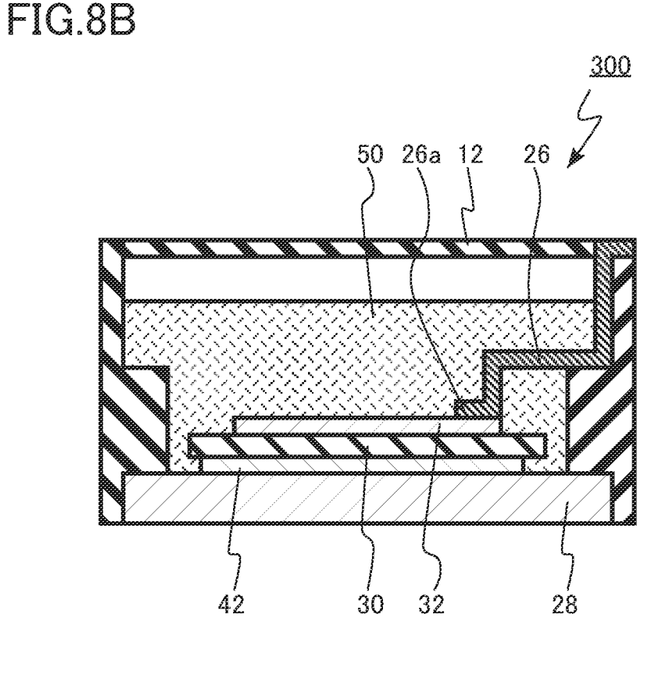

FIG. 7 is a schematic cross-sectional view of the semiconductor device according to the third embodiment. FIG. 7 is a diagram corresponding to FIG. 2 of the first embodiment. FIGS. 8A and 8B are schematic cross-sectional views of the semiconductor device according to the third embodiment. FIGS. 8A and 8B are diagrams corresponding to FIGS. 3A and 3B of the first embodiment.

The semiconductor device of the third embodiment is a power semiconductor module 300.

The power semiconductor module 300 according to the third embodiment includes a resin case 10, a lid 12, a first main terminal 14, a second main terminal 16, an AC output terminal 18, a first gate terminal 20, a second gate terminal 22, a first detection terminal 24, a second detection terminal 26, a metal base 28, an insulating substrate 30, a first metal layer 32, a second metal layer 34, a third metal layer 36, a first gate metal layer 38, a second gate metal layer 40, a back-surface metal layer 42, a first MOSFET 44 (semiconductor chip), a second MOSFET 46, a bonding wire 48, and a sealing resin 50 (sealing material).

The first main terminal 14 has a first end 14a, a second end 14b, and a first wiring connection hole 14c (hole). The second main terminal 16 has a third end 16a, a fourth end 16b, and a second wiring connection hole 16c. The first detection terminal 24 has an end 24a. The second detection terminal 26 has an end 26a.

The sealing resin 50 has a first portion 50a and a second portion 50b. The material of the second portion 50b is different from the material of the first portion 50a.

For example, the second portion 50b is made by using a material having higher insulation properties than the first portion 50a. In addition, for example, the second portion 50b is made by using a material having higher strength than the first portion 50a.

The first portion 50a is made of, for example, a silicone gel. The second portion 50b is made of, for example, an epoxy resin.

At least a portion of the first main terminal 14 and the second main terminal 16 is surrounded by the second portion 50b. The connection portion X between the first detection terminal 24 and the first main terminal 14 is surrounded by the second portion 50b.

According to the power semiconductor module 300 according to the third embodiment, it is possible to improve the insulation properties of, for example, the first main terminal 14 and the second main terminal 16. In addition, for example, it is possible to suppress the deformation of the first main terminal 14 and the second main terminal 16.

As described above, according to the third embodiment, similarly to the first embodiment, it is possible to realize the miniaturization of the power semiconductor module. In addition, adjustment of the inductance between the two detection terminals is facilitated. In addition, the decrease in the measurement accuracy of the main current due to the temperature change is suppressed. In addition, it is possible to further improve the characteristics of the power semiconductor module.

Fourth Embodiment

A semiconductor device according to a fourth embodiment is different from the semiconductor device according to the first embodiment in that the semiconductor device according to the fourth embodiment further includes a third detection terminal electrically connected between the third end and the fourth end of the second main terminal and a fourth detection terminal electrically connected to the second metal layer. Hereinafter, a portion of the contents overlapping with those of the first embodiment will be omitted in description.

Figure 9:
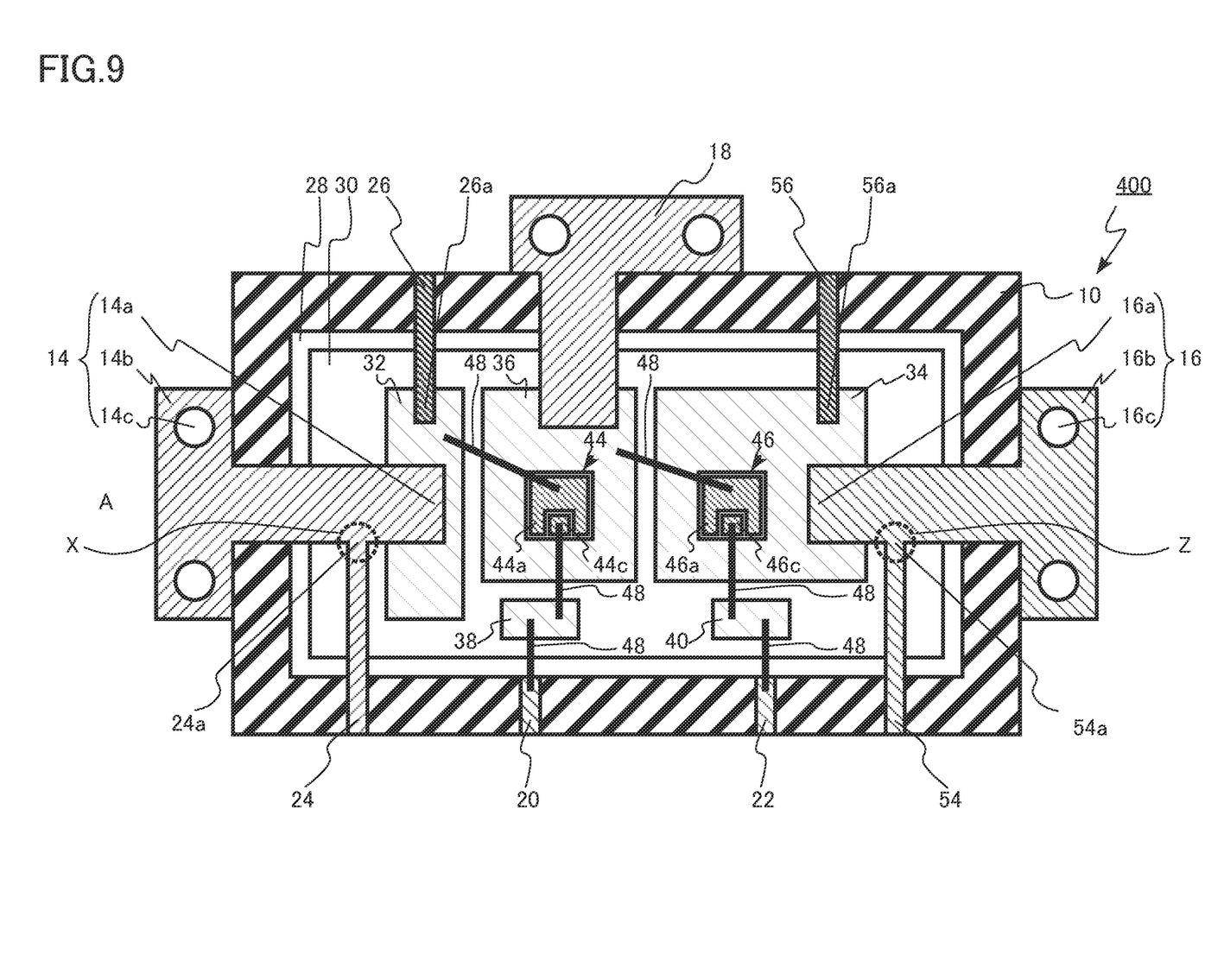
FIG. 9 is a schematic top view of a semiconductor device according to a fourth embodiment.
Figure 10:
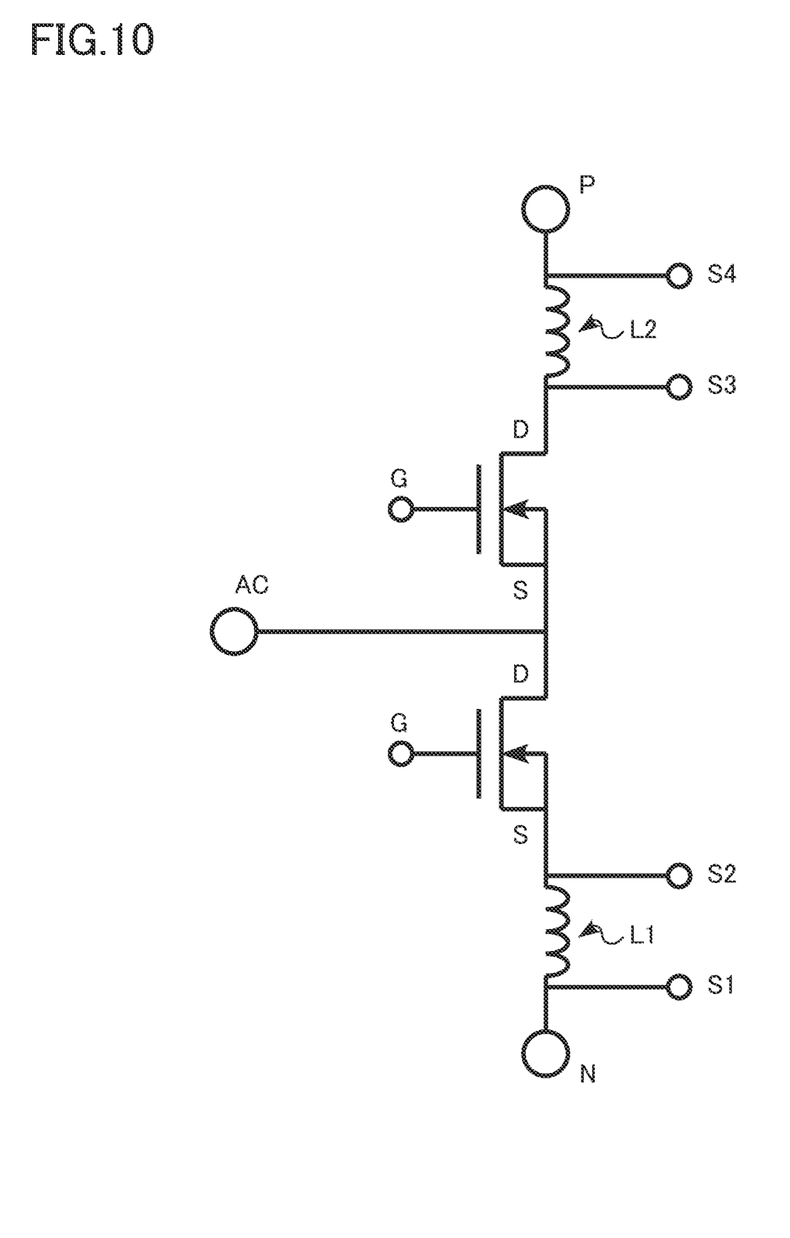
FIG. 10 is an equivalent circuit diagram of the semiconductor device according to the fourth embodiment.

FIG. 9 is a schematic top view of the semiconductor device according to the fourth embodiment. FIG. 9 is a diagram corresponding to FIG. 1 of the first embodiment. FIG. 10 is an equivalent circuit diagram of the semiconductor device according to the fourth embodiment.

The semiconductor device of the fourth embodiment is a power semiconductor module 400. As illustrated in FIG. 10, in the power semiconductor module 400 according to the fourth embodiment, two MOSFETs are connected in series. The power semiconductor module according to the fourth embodiment is a so-called "2 in 1" type module in which a half bridge circuit can be configured with one module. For example, a three-phase inverter circuit can be configured by using three power semiconductor modules according to the fourth embodiment.

As illustrated in FIG. 10, the power semiconductor module 100 includes a power terminal N, a power terminal P, an AC output terminal AC, a first detection terminal S1, a second detection terminal S2, a third detection terminal S3, a fourth detection terminal S4, an inductor L1, and an inductor L2. The first detection terminal S1 and the second detection terminal S2, and the third detection terminal S3 and the fourth detection terminal S4 respectively have a function of monitoring a main current flowing between the power terminal N and the power terminal P.

The power semiconductor module 400 according to the fourth embodiment includes a resin case 10, a lid 12, a first main terminal 14, a second main terminal 16, an AC output terminal 18, a first gate terminal 20, a second gate terminal 22, a first detection terminal 24, a second detection terminal 26, a metal base 28, an insulating substrate 30, a first metal layer 32, a second metal layer 34, a third metal layer 36, a first gate metal layer 38, a second gate metal layer 40, a back-surface metal layer 42, a first MOSFET 44 (semiconductor chip), a second MOSFET 46, a bonding wire 48, a sealing resin 50 (sealing material), a third detection terminal 54, and a fourth detection terminal 56.

The first main terminal 14 has a first end 14a, a second end 14b, and a first wiring connection hole 14c (hole). The second main terminal 16 has a third end 16a, a fourth end 16b, and a second wiring connection hole 16c. The first detection terminal 24 has an end 24a. The second detection terminal 26 has an end 26a. The third detection terminal 54 has an end 54a. The fourth detection terminal 56 has an end 56a.

FIG. 9 is a top view of the power semiconductor module 400 from which the lid 12 and the sealing resin 50 are removed.

The first main terminal 14 has a first end 14a, a second end 14b, and a first wiring connection hole 14c (hole). The first main terminal 14 is electrically connected to the first metal layer 32.

The first main terminal 14 corresponds to the power terminal N in FIG. 10. For example, a negative voltage is applied to the first main terminal 14 from the outside.

The second main terminal 16 has a third end 16a, a fourth end 16b, and a second wiring connection hole 16c (hole). The second main terminal 16 is electrically fixed to the second metal layer 34.

The second main terminal 16 corresponds to the power terminal P in FIG. 10. For example, a positive voltage is applied to the second main terminal 16 from the outside.

The first detection terminal 24 is electrically connected to the first main terminal 14. The first detection terminal 24 is fixed between the first end 14a and the second end 14b of the first main terminal 14. The first detection terminal 24 has an end 24a. The end 24a of the first detection terminal 24 is fixed to the first main terminal 14 at the connection portion (X in FIG. 9).

The end of the first detection terminal 24 opposite to the end 24a is provided, for example, outside the resin case 10 and the lid 12. The connection portion X between the first detection terminal 24 and the first main terminal 14 is located between the insulating substrate 30 and the lid 12.

At least a portion of the first detection terminal 24 is surrounded by the sealing resin 50. The connection portion X between the first detection terminal 24 and the first main terminal 14 is surrounded by the sealing resin 50.

The first detection terminal 24 corresponds to the first detection terminal S1 in FIG. 10. The first detection terminal 24 has a function of monitoring a main current flowing between the first main terminal 14 and the second main terminal 16.

The first detection terminal 24 is made of a metal. The first detection terminal 24 is made of, for example, copper.

The first detection terminal 24 is integrally formed of, for example, the same material as the first main terminal 14.

The first detection terminal 24 can be connected to the first main terminal 14 by using, for example, a bonding wire.

The second detection terminal 26 is electrically connected to the first metal layer 32. The second detection terminal 26 has an end 26a. The end 26a of the second detection terminal 26 is fixed to, for example, the first metal layer 32.

The end 26a of the second detection terminal 26 is bonded to the first metal layer 32 by using, for example, a solder layer or a silver nanoparticle layer (not illustrated). In addition, the end 26a is bonded to the first metal layer 32 by, for example, ultrasonic bonding.

The end of the second detection terminal 26 opposite to the end 26a is provided, for example, outside the resin case 10 and the lid 12.

In addition, the second detection terminal 26 may not be directly fixed to the first metal layer 32 as long as the second detection terminal 26 is electrically connected to the first metal layer 32. For example, the second detection terminal 26 and the first metal layer 32 may be electrically connected via the bonding wire 48. In addition, for example, the second detection terminal 26 and the first metal layer 32 may be electrically connected to each other with a metal layer different from the first metal layer 32 interposed between the second detection terminal 26 and the first metal layer 32.

At least a portion of the second detection terminal 26 is surrounded by the sealing resin 50.

The second detection terminal 26 corresponds to the second detection terminal S2 in FIG. 10. The second detection terminal 26 has a function of monitoring a main current flowing between the first main terminal 14 and the second main terminal 16.

The second detection terminal 26 is made of a metal. The second detection terminal 26 is made of, for example, copper.

The third detection terminal 54 is electrically connected to the second main terminal 16. The third detection terminal 54 is fixed between the third end 16a and the fourth end 16b of the second main terminal 16. The third detection terminal 54 has an end 54a. The end 54a of the third detection terminal 54 is fixed to the second main terminal 16 at the connection portion (Z in FIG. 9).

The end of the third detection terminal 54 opposite to the end 54a is provided, for example, outside the resin case 10 and the lid 12. The connection portion Z between the third detection terminal 54 and the second main terminal 16 is located between the insulating substrate 30 and the lid 12.

At least a portion of the third detection terminal 54 is surrounded by the sealing resin 50. The connection portion Z between the third detection terminal 54 and the second main terminal 16 is surrounded by the sealing resin 50.

The third detection terminal 54 corresponds to the third detection terminal S3 in FIG. 10. The third detection terminal 54 has a function of monitoring a main current flowing between the first main terminal 14 and the second main terminal 16.

The third detection terminal 54 is made of a metal. The third detection terminal 54 is made of, for example, copper.

The third detection terminal 54 is integrally formed of, for example, the same material as the second main terminal 16.

The third detection terminal 54 can be connected to the second main terminal 16 by using, for example, a bonding wire.

The fourth detection terminal 56 is electrically connected to the second metal layer 34. The fourth detection terminal 56 has an end 56a. The end 56a of the fourth detection terminal 56 is fixed to, for example, the second metal layer 34.

The end 56a of the fourth detection terminal 56 is bonded to the second metal layer 34 by using, for example, a solder layer or a silver nanoparticle layer (not illustrated). The end 56a is bonded by, for example, ultrasonic bonding.

The end of the fourth detection terminal 56 opposite to the end 56a is provided, for example, outside the resin case 10 and the lid 12.

In addition, the fourth detection terminal 56 may not be directly fixed to the second metal layer 34 as long as the fourth detection terminal 56 is electrically connected to the second metal layer 34. For example, the fourth detection terminal 56 and the second metal layer 34 may be electrically connected via the bonding wire 48. In addition, for example, the fourth detection terminal 56 and the second metal layer 34 may be electrically connected to each other with a metal layer different from the second metal layer 34 interposed between the fourth detection terminal 56 and the second metal layer 34.

At least a portion of the fourth detection terminal 56 is surrounded by the sealing resin 50.

The fourth detection terminal 56 corresponds to the fourth detection terminal S4 in FIG. 10. The fourth detection terminal 56 has a function of monitoring a main current flowing between the first main terminal 14 and the second main terminal 16.

The fourth detection terminal 56 is made of a metal. The fourth detection terminal 56 is made of, for example, copper.

The power semiconductor module 400 according to the fourth embodiment can monitor the main currents on both the first main terminal 14 side and the second main terminal 16 side. Therefore, for example, in a case where a short circuit occurs, the location of the short circuit can be easily identified. In addition, for example, the life prediction accuracy of the power semiconductor module 400 is improved.

As described above, according to the fourth embodiment, similarly to the first embodiment, it is possible to realize the miniaturization of the power semiconductor module. In addition, adjustment of the inductance between the two detection terminals is facilitated. In addition, the decrease in the measurement accuracy of the main current due to the temperature change is suppressed. In addition, the location of the short circuit can be easily identified. In addition, the life prediction accuracy of the module is improved.

In the first to fourth embodiments, the case where the MOSFET is used as the semiconductor chip has been described as an example, but the semiconductor chip is not limited to these. For example, other transistors or diodes such as IGBT, Schottky barrier diode (SBD), and PIN diode can be employed. In addition, a combination of transistors and diodes can be employed.

In the first to fourth embodiments, the case where the number of semiconductor chips is two has been described as an example, but the number of semiconductor chips may be one or three or more.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an insulating substrate having a first metal layer and a second metal layer on a surface of the insulating substrate;
   a semiconductor chip including an upper electrode and a lower electrode, the upper electrode being electrically connected to the first metal layer, the lower electrode being electrically connected to the second metal layer;

a first main terminal including a first end and a second end, the first end being electrically connected to the first metal layer;

a second main terminal including a third end and a fourth end, the third end being electrically connected to the second metal layer;

a first detection terminal being electrically connected between the third end and the fourth end of the second main terminal; and a second detection terminal being electrically connected to the second metal layer, the second detection terminal being separated from the first detection terminal, the second detection terminal being fixed to the second metal layer.

2. The semiconductor device according to claim 1, further comprising:

a frame body surrounding the insulating substrate; and a sealing material provided inside the frame body, wherein the third end and at least a portion of the first detection terminal are surrounded by the sealing material.

3. The semiconductor device according to claim 2, wherein a connection portion between the second main terminal and the first detection terminal is surrounded by the sealing material.

4. The semiconductor device according to claim 1, further comprising a lid, the semiconductor chip interposed between the insulating substrate and the lid, wherein a connection portion between the second main terminal and the first detection terminal is located between the insulating substrate and the lid.

5. The semiconductor device according to claim 1, wherein the second main terminal has a hole configured to connect a wiring at the fourth end.

6. The semiconductor device according to claim 1, wherein the second main terminal and the first detection terminal are integrally formed of the same material.

\* \* \* \* \*